US008577920B2

(12) United States Patent
Hayashi

(10) Patent No.: US 8,577,920 B2
(45) Date of Patent: Nov. 5, 2013

(54) METHOD AND RECORDING MEDIUM

(75) Inventor: Hirooki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1009 days.

(21) Appl. No.: 12/028,554

(22) Filed: Feb. 8, 2008

(65) Prior Publication Data

US 2008/0222110 A1 Sep. 11, 2008

(30) Foreign Application Priority Data

Mar. 7, 2007 (JP) ................................ 2007-057825

(51) Int. Cl.
*G06F 17/30* (2006.01)
*G06F 7/00* (2006.01)

(52) U.S. Cl.
USPC ........................................................ 707/780

(58) Field of Classification Search
USPC ................................................... 707/5, 780
See application file for complete search history.

(56) References Cited

U.S. PATENT DOCUMENTS

| 7,421,449 B2 * | 9/2008 | Williams et al. ....................... 1/1 |
| 7,471,677 B2 * | 12/2008 | Deshpande .................... 370/389 |
| 7,509,321 B2 * | 3/2009 | Wong et al. ............................ 1/1 |
| 2009/0083281 A1 * | 3/2009 | Sarig et al. ....................... 707/10 |

FOREIGN PATENT DOCUMENTS

| JP | 11-120001 | 4/1999 |
| JP | 11-167587 | 6/1999 |
| JP | 2001-14373 | 1/2001 |

OTHER PUBLICATIONS

Japanese Office Action issued Nov. 8, 2011 in corresponding Japanese Patent Application No. 2007-057825.

* cited by examiner

*Primary Examiner* — Kuen Lu
(74) *Attorney, Agent, or Firm* — Staas & Halsey LLP

(57) ABSTRACT

A method executed by a computer includes searching a design subject having similar attribute information from attribute information on a design subject designed in the past and histories of descriptions of improvements based on input information on a design subject; obtaining a description of an improvement on the searched design subject having similar attribute information from the histories, obtaining a design subject the description of an improvement of which has an effect of the improvement, and outputting improved input information, wherein the attribute information contributing to the improvement of the design subject is obtained and reflected in the input information, and the history of the improved input information is stored.

11 Claims, 10 Drawing Sheets

FIG.2

| NAMES OF PARTS | VERSION NUMBERS | FORM INFORMATION | DESCRIPTIONS OF IMPROVEMENTS |
|---|---|---|---|
| b | 01 | B1 | NONE |
| b | 02 | B13 | REDUCED IN BUILDING COSTS: 10 YEN/PIECE |
| b | 03 | B2 | NONE |
| b | 04 | B14 | REDUCED IN PROCESSING COSTS: 20 YEN/PIECE |
| c | 01 | C1 | NONE |
| ·· | ·· | ·· | ·· |

FIG.5

| NAMES OF PARTS | VERSION NUMBERS | FORM INFORMATION | DESCRIPTIONS OF IMPROVEMENTS | EFFECTS OF IMPROVEMENTS |
|---|---|---|---|---|
| b | 01 | ...B1 | NONE | NONE |
| b | 02 | ...B13 | REDUCED IN BUILDING COSTS | 10 YEN/PIECE |
| b | 03 | ...B2 | NONE | NONE |
| b | 04 | ...B14 | REDUCED IN PROCESSING COSTS | 20 YEN/PIECE |
| c | 01 | ...C1 | NONE | NONE |
| .. | .. | .. | .. | .. |

FIG.6

| NAMES OF PARTS | VERSION NUMBERS | FORM INFORMATION | DESCRIPTIONS OF IMPROVEMENTS |
|---|---|---|---|
| b | 01 | B1 | NONE |
| b | 02 | B13 | REDUCED IN BUILDING COSTS: 10 YEN/PIECE |
| b | 03 | B2 | NONE |
| b | 04 | B14 | REDUCED IN PROCESSING COSTS: 20 YEN/PIECE |
| b | 05 | B21 | REDUCED IN PROCESSING COSTS: 30 YEN/PIECE |
| b | 06 | B22 | |
| ‥ | ‥ | ‥ | ‥ |

FIG.10

| NAMES OF DEVICES | VERSION NUMBERS | ASSEMBLY INFORMATION | DESCRIPTIONS OF IMPROVEMENTS |
|---|---|---|---|
| M | 01 | X1 | NONE |
| M | 02 | X4 (ASSEMBLY POSITION WAS CHANGED) | WORKABILITY WAS IMPROVED |
| M | 03 | X3 (PARTS ARE ADDED) | STRENGTH WAS INCREASED |

METHOD AND RECORDING MEDIUM

BACKGROUND

1. Field

The present art relates to a design method and a recording medium and, in particular, to a design method for designing a design subject such as a part, and a device and a computer readable recording medium storing a program that causes a computer to implement the design method.

2. Description of the Related Art

When a designer designs a new apparatus and new part, the designer refers to an apparatus designed in the past and a part designed in the past having the same effect.

In a related art, a difference between the part designed in the past and the new part under design is displayed. The designer can design the new part to have the effect of the part designed in the past by referring to the display information. The effect may decrease processing costs of the part.

Japanese Laid-open Patent Publication 11-167587 disclosed a computer aided design method judging a combination of shapes of parts.

Japanese Laid-open Patent Publication 2001-14373 disclosed a computer aided design method correlating some processed units.

But it is not easy to design a part having a specified effect by referring to display information. So, a designer may design a part that does not have the effect. As a result, the number of man-hours needed to design the part may increase, or a processing cost of the part may increase.

SUMMARY

According to an aspect of an embodiment, a method executed by a computer may include an attribute searching operation searching a design subject having similar attribute information from attribute information on a design subject designed in the past and histories of descriptions of improvements based on input information on a design subject, an improved part obtaining operation obtaining a description of an improvement on the searched design subject having similar attribute information from the histories, an attribute calculation operation performing an operation on the attribute information of the design subject having similar attribute information and obtaining a design subject the description of an improvement of which has an effect of the improvement, and an output operation outputting improved input information, wherein the improved part obtaining operation obtains the attribute information contributing to the improvement of the design subject, reflects it to the input information and stores the history of the improved input information based on the operation result of the attribute calculation operation.

The above-described embodiments of the present invention are intended as examples, and all embodiments of the present invention are not limited to including the features described above.

BRIEF DESCRIPTION OF THE DRAWINGS

FIG. 2 is an example of the histories stored in a storage device;
FIG. 5 is an example of the histories;
FIG. 6 is an example of the descriptions of improvements;
FIG. 10 is an example of the histories stored in a storage device.

DETAILED DESCRIPTION OF THE EMBODIMENTS

Figure 1:
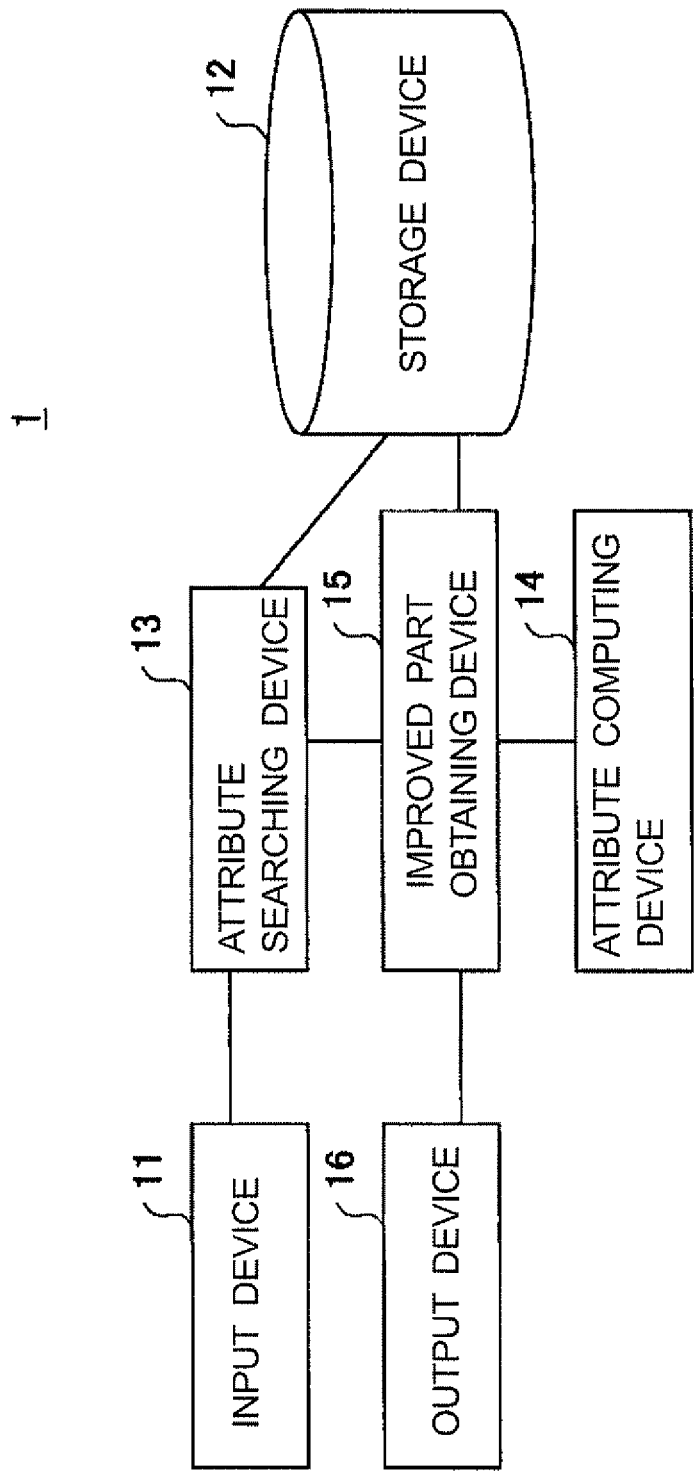
FIG. 1 is a block diagram of a first embodiment.

Reference may now be made in detail to embodiments of the present invention, examples of which are illustrated in the accompanying drawings, wherein like reference numerals refer to like elements throughout.

A first embodiment will be described below. FIG. 1 is a block diagram of the first embodiment. A design apparatus 1 shown in FIG. 1 includes an input device 11, a storage device 12, an attribute searching device 13, an attribute calculation device 14, an improved part obtaining device 15 and an output device 16. The design apparatus 1 is configurable by a generic computer system. In this case, the input device 11 is configurable by a keyboard and/or a mouse of the computer system. The storage device 12 is configurable by an internal storage device or external storage device of the computer system. The attribute searching device 13, attribute calculation device 14 and improved part obtaining device 15 are configurable by a processor such as a central processing unit (CPU) of the computer system. The output device 16 is configurable by a display device of the computer system.

The CPU of the computer system implements the design method by executing a program such as a design aiding program stored in the storage device 12. The program may be downloaded from the outside of the computer system to the storage device 12, or may be loaded from a computer-readable recording medium and be stored in the storage device 12. The storage device 12 may be configured by a computer-readable recording medium itself storing the program.

The design subject of this embodiment may be a part or a device, for example. However, it is assumed that a part is a design subject for convenience in describing this embodiment. The attribute information of the part is form information, here.

A designer inputs information on a new part, a part to be improved or a part to be analyzed (which will be called input part information, hereinafter) through the input device 11. The input part information includes a part name and form information. The storage device 12 stores the form information and histories of descriptions of improvement on a part designed in the past. FIG. 2 shows an example of the histories stored in the storage device 12. The histories shown in FIG. 2 include part names, version numbers, form information and descriptions of improvements. The part having a same part name b may have different version numbers. For example, the part having the part name b with a version number 01 has form information B1 but no recorded description of an improvement. The part having the part name b with a version number 02 has form information B2 and a description of an improvement "Reduced in building costs: 10 yen/piece".

The attribute searching device 13 searches a part having similar form information from the histories stored in the storage device 12 based on the form information included in the input part information. The improved part obtaining device 15 obtains a description of an improvement on the searched part having similar form information from the histories stored in the storage device 12. The attribute calculation device 14 obtains a difference form, sum form and/or common form, for example, between parts having a similar form by performing an operation thereon and sorts parts in a decreasing order of the degree of the effects of improvements in descriptions of improvements.

The improved part obtaining device 15 obtains form information contributing to an improvement of a part and reflects it to the input part information based on the operation result of the attribute calculation device 14 and stores the histories of the input part information to the storage device 12. The improved part obtaining device 15 displays the form information contributing to an improvement of the part by the output device 16.

A designer may reflect the form information to the input part information by selecting the form information displayed on the output device 16 by using the input device 11. The improved part obtaining device 15 may automatically reflect the form information having a description of an improvement the effect of which is the highest, which is obtained by the operation by the attribute calculation device 14, to the input part information.

The output device 16 displays the input part information reflecting the form information contributing to an improvement of the part.

Figure 3:
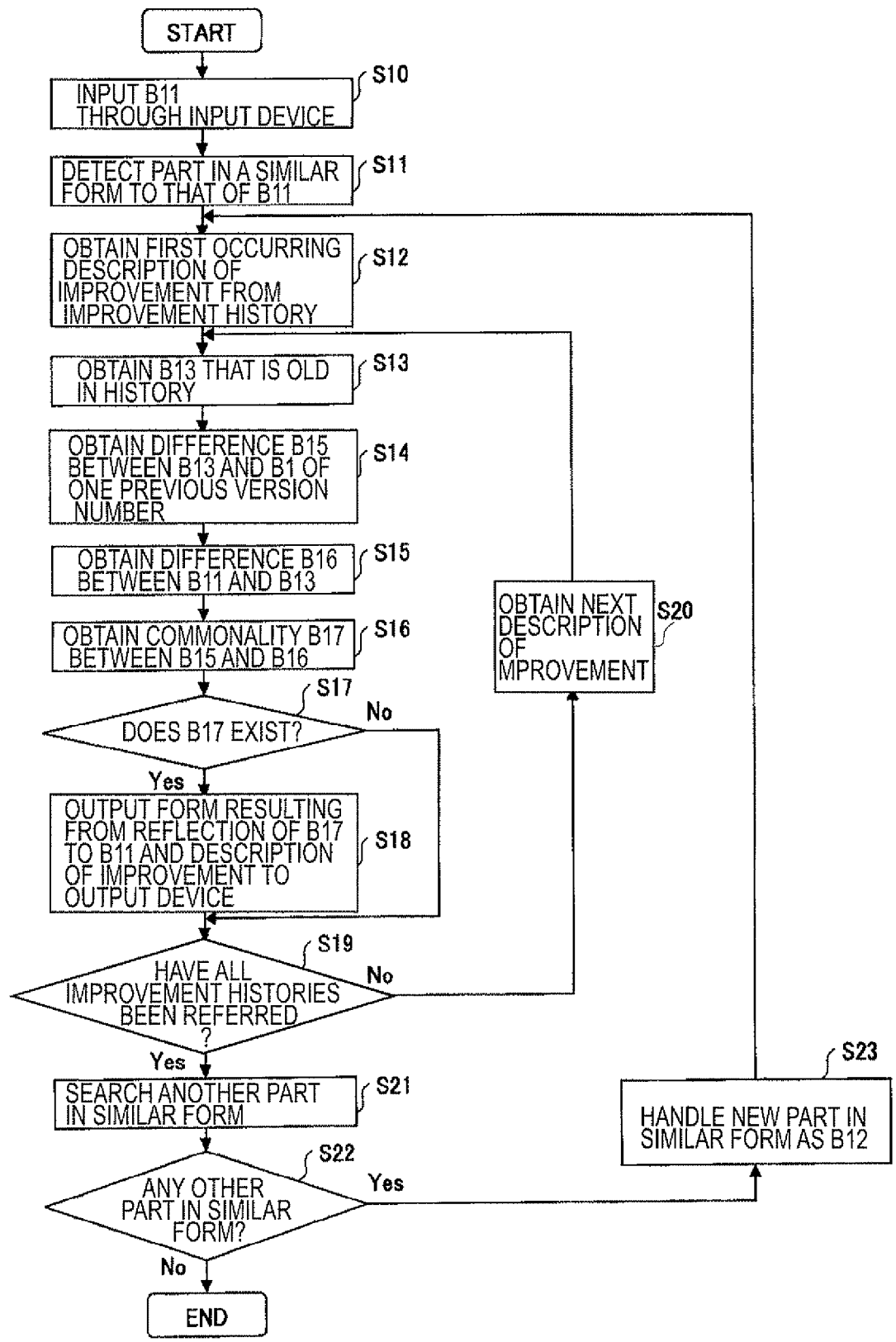
FIG. 3 is a flowchart of the first embodiment.

FIG. 3 is a flowchart of this embodiment. The processing shown in FIG. 3 is performed by the CPU of the computer system, for example. For convenience of description, it is assumed here that the form information in the description of the improvement having the highest degree of effect of the improvement is automatically reflected to the input part information.

Figure 4A:
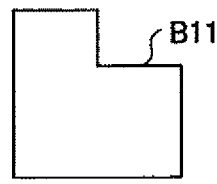
FIGS. 4A to 4H are examples of the form of a part.

Referring to FIG. 3, in operation S10, the input device 1 inputs the input part information including input form information B11 to the attribute searching device 3. FIG. 4A is an example of the form information B11.

Figure 4B:
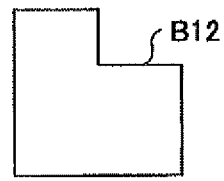

In operation S11, the attribute searching device 13 searches a part having similar form information including form information B12 from the histories stored in the storage device 12 based on the form information B11 included in the input part information. FIG. 4B is an example of the form information B12.

Figure 4C:
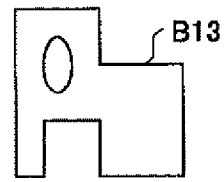
Figure 4D:
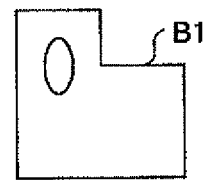

In operation S12, the improved part obtaining device 15 obtains the description of an improvement of the searched part having similar form information from the histories stored in the storage device 12. In operation S13, the improved part obtaining device 15 obtains form information B13 of the part the description of an improvement of which has been obtained first. The part the description of an improvement of which has been obtained first is the oldest in the histories among the parts the descriptions of improvements of which have been obtained. FIG. 4C is an example of the form information B13.

in operation S14, the attribute calculation device 14 obtains the form information B13 and form information B1. The form information B1 has information on a part having one previous version number in histories independent of the presence of the description of an improvement. FIG. 4D is an example of the form information B1.

Figure 4E:
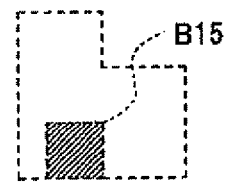

The part having the form information B13 and B1 corresponds to those having the part name b and version numbers 02 and 01 in FIG. 2. Furthermore, in operation S14, the attribute calculation device 14 obtains form information B15, which is a difference form between the form information B13 and the form information B1. FIG. 4E is an example of the form information B15.

Figure 4F:
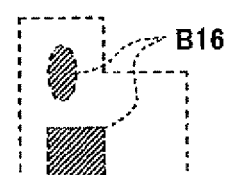

In operation S15, the attribute calculation device 14 obtains form information B16, which is a difference form between the form information B11 and the form information B13. FIG. 4F is an example of the form information B16.

Figure 4G:
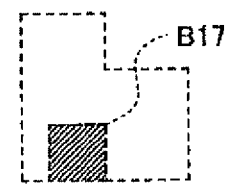

In operation S16, the attribute calculation device 14 obtains form information B17, which is a common form between the form information B15 and the form information B16. FIG. 4G is an example of the form information B17.

In operation S17, the attribute calculation device 14 determines whether any form information B17 exists or not. If the determination results in YES, the processing moves to operation S18. If the determination results in NO, the processing moves to operation S19.

Figure 4H:
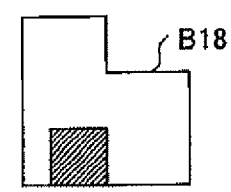

In operation S18, the improved part obtaining device 15 outputs the form information B18 resulting from the reflection of the form information B17 to the form information B11 and the description of the improvement to the output device 16 for display. Next, the improved part obtaining device 15 stores the history of the improved input part information in the storage device 12. FIG. 4H is an example of the form information B18.

In operation S19, the improved part obtaining device 15 determines whether all of those having descriptions of improvements among the parts having similar form information to the form information B11 have been referred or not. If the determination results in YES, the processing moves to operation S21. If the determination results in NO, the processing moves to operation S20.

In operation S20, the improved part obtaining device 15 obtains the description of an improvement of the next part having similar form information to the form information B11, and the processing returns to operation S13.

In operation S21, the attribute searching device 13 searches another part having similar form information to the form information B11 among the histories stored in the storage device 12 based on the form information B11 included in the input part information.

In operation S22, the attribute searching device 13 determines whether any other part having similar form information exists or not. If the determination results in YES, the processing moves to operation S23. If the determination results in NO, the processing ends.

In operation S23, the attribute searching device 13 handles the form information B12 as the form information of a new part having similar form information, and the processing returns to operation S12.

FIG. 5 is an example of the histories available for sorting parts in a decreasing order of the degree of effect of improvements of the descriptions of the improvements by the attribute calculation device 14. In FIG. 5, the field of the description of an improvement shown in FIG. 2 includes two fields for an improvement and the effect of the improvement. In a case where the storage device 12 stores the histories in the data structure as shown in FIG. 5, the attribute calculation device 14 can sort parts in a decreasing order of the effects of improvements corresponding to the descriptions of the improvements by referring to the field of the effects of improvements in the histories.

FIG. 6 is an example in a case where descriptions of improvements can be obtained through multiple changes in form, which are stored in the storage device 12. In a case where the part having the part name b is changed from a version number 04 and form information B14 to a version number 05 and form information B21, the change does not result in a significant description of the improvement. However, in a case where the part having the part name b is changed from the version number 04 and form information B14 to a version number 06 and form information B22 through the version number 05 and form information B21, the change can result in a significant description of the improvement.

A second embodiment will be described below. Since the block diagram of the second embodiment is identical to FIG. 1, the illustration and description will be omitted herein.

A design subject of this embodiment is a part or a device, for example. However, it is assumed that a device including multiple parts is a design subject for convenience of the description of this embodiment. It is also assumed here that the attribute information of the device is assembly information.

Figure 7:
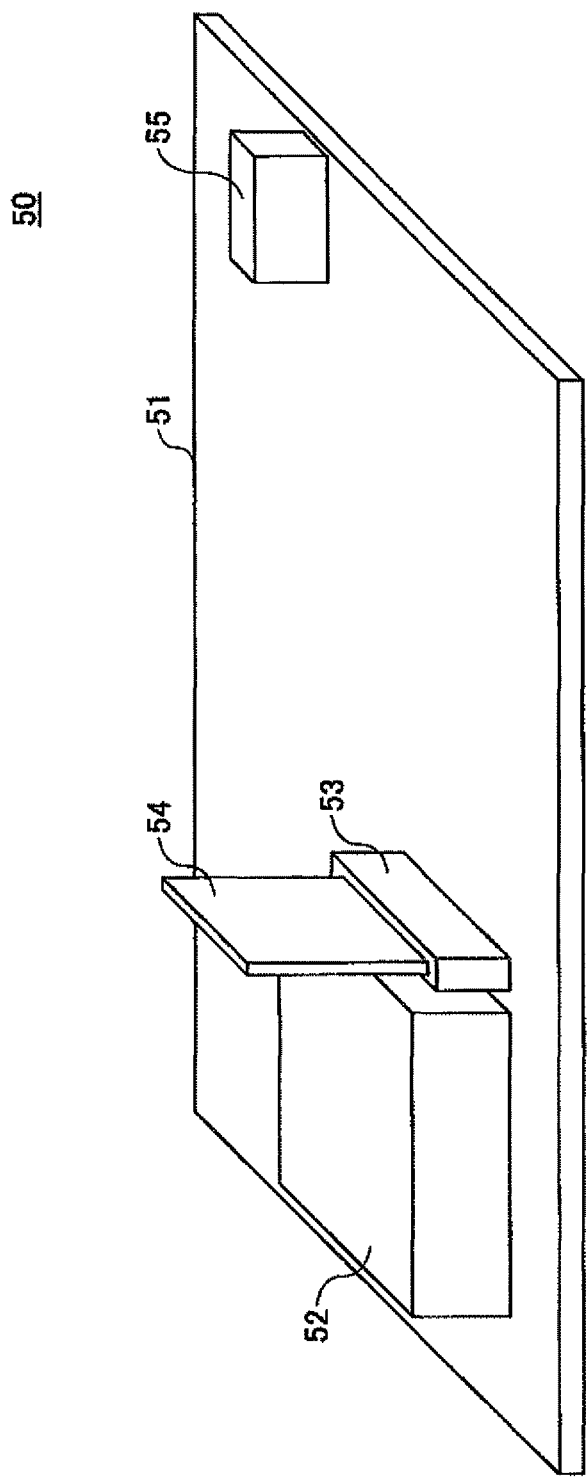
FIG. 7 is a perspective diagram of an apparatus with a version number 01 and an apparatus name M.
Figure 8:
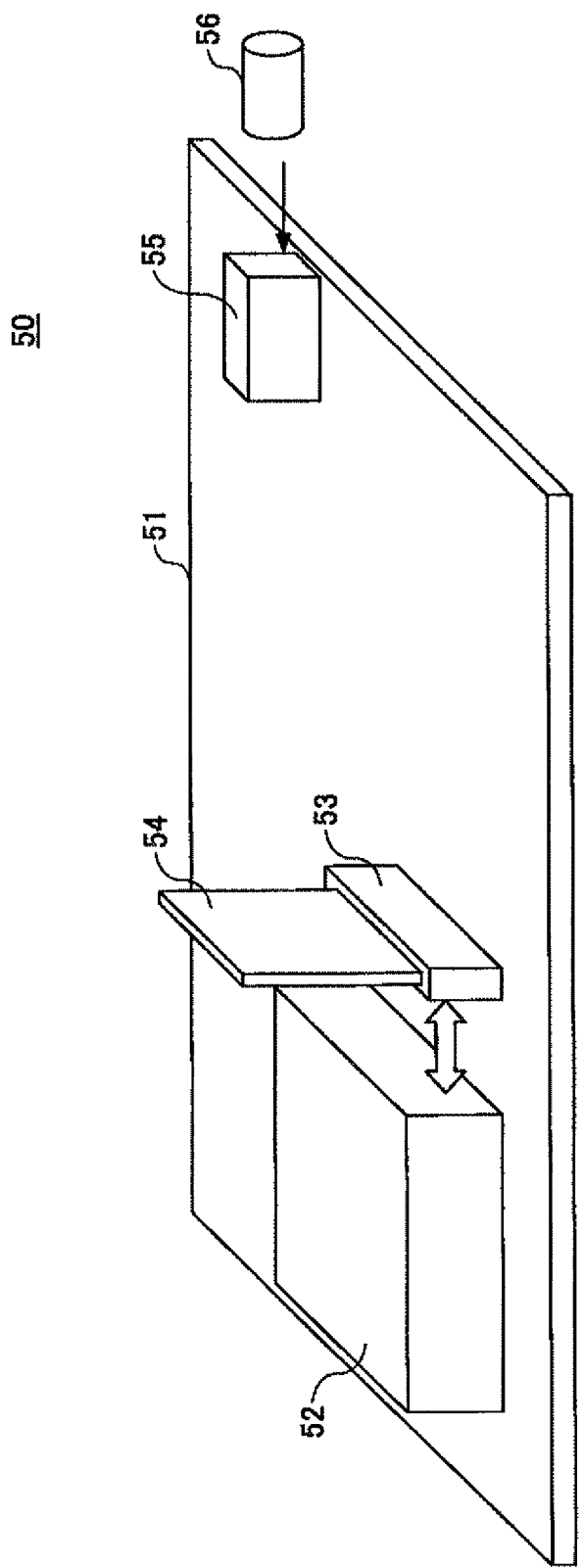
FIG. 8 is a perspective diagram of an apparatus with a version number 02 and the apparatus name M.
Figure 9:
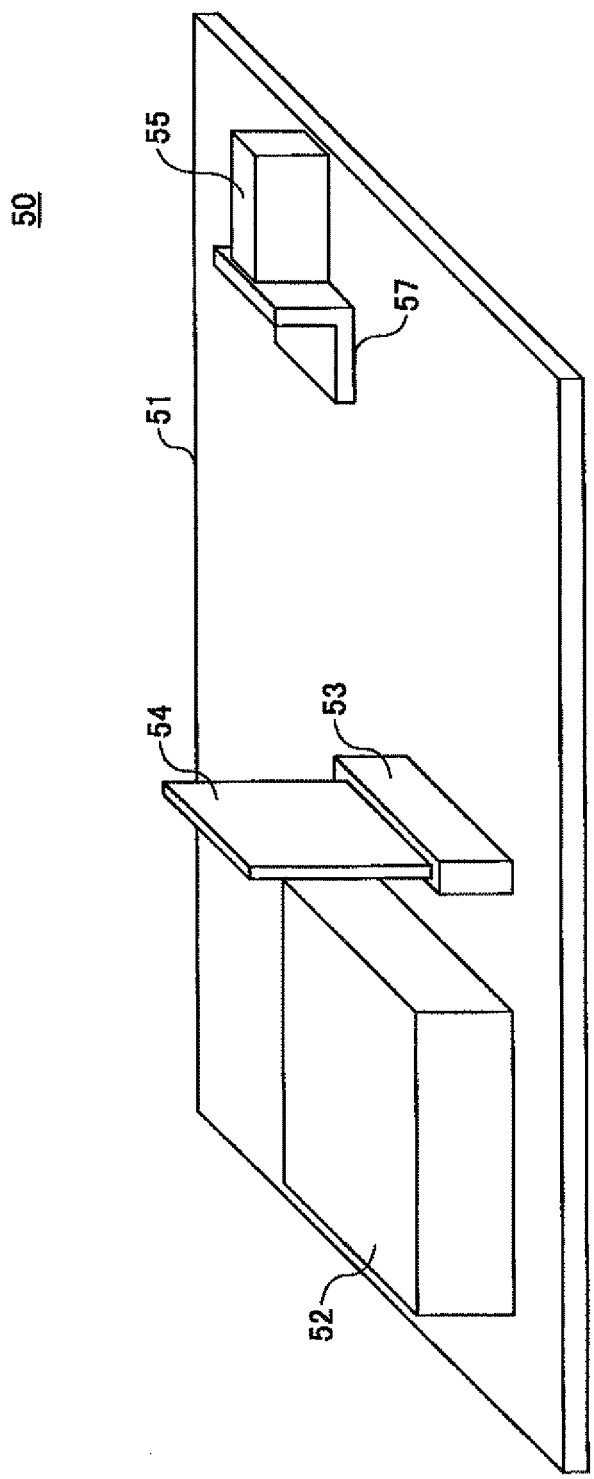
FIG. 9 is a perspective diagram of an apparatus with a version number 03 and the apparatus name M.

FIGS. 7 to 9 are perspective views schematically showing a device under a device name M of version numbers 01 to 03. A device 50 shown in FIGS. 7 to 9 includes a substrate 51. A part 52, connector 53, cable 54 and socket 55 are on the substrate 51. It is difficult to attach the cable 54 to the device 50 of the version number 01 shown in FIG. 7 since the distance between the part 52 and the connector 53 is short.

The attachment of the cable 54 to the device 50 of the version number 02 shown in FIG. 8 is easier than the attachment to the device 50 of the version number 01 since the position of the connector 53 can be moved to the position slightly away from the part 52. The socket 55 is not more easily peeled off from the substrate 51 in the device 50 of the version number 03 shown in FIG. 9, compared with the device 50 of the version numbers 01 and 02, even when a twisting force is applied to the socket 55 for attaching/removing a plug 56 to/from the socket 55, since a reinforcing plate 57 is added to the back of the socket 55.

FIG. 10 is an example of the histories stored in the storage device 12. Each of the histories includes a device name, a version number, assembly information and the description of an improvement. The device 50 having a same device name M may have different version numbers.

For example, one history regarding the device 50 having the device name M of a version number 02 includes "Assembly position was changed" as the assembly information and "Workability was improved" as the description of the improvement. The other history regarding the device 50 having the device name M of a version number 03 includes "Parts are added" as the assembly information and "Strength was increased" as the description of the improvement.

Also in this embodiment, the operations are similar to those in the flowchart shown in FIG. 3. However, this embodiment is different from the first embodiment in that the attribute information to be used is assembly information instead of form information.

The attribute information of a design subject is not limited to form information and assembly information. The description of an improvement is not limited to the descriptions of the improvements in the embodiments. The description of an improvement may be expressed by a numerical value and a non-numerical value.

For example, in a case where the form of a part is changed by chamfering, for example, the description of the improvement may be an improvement of degree of the safety in an assembly operation by protecting the hands from easily cutting by the edges of the part. In a case where a part is changed by performing surface processing such as coating on the part, the description of the improvement may be the protection of the part from easily getting soiled and an improvement of the yield of an appearance test.

Furthermore, in a case where the material of a radiating fin in a device is changed, the description of the improvement is the improvement of the heat radiation characteristic of the device. In this way, the attribute information may be at least one selected from a group including form information, assembly information, surface processing information and material information.

A manufacturing system can automatically manufacture a part based on the input part information reflecting the attribute information contributing to the improvement of the part, which is output from the output device 16.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A design method by computer comprising:
   an attribute searching operation searching for a design subject having similar attribute information similar to attribute information on a design subject designed in the past and histories of descriptions of improvements based on input information on the design subject;
   an improved part obtaining operation obtaining a description of an improvement on the searched design subject having the similar attribute information from the histories;
   an attribute calculation operation performing an operation on the similar attribute information of the design subject and obtaining a design subject having the description of an improvement of which has an effect of the improvement; and
   an output operation outputting improved input information,
   wherein the improved part obtaining operation obtains the attribute information contributing to the improvement of the design subject, reflects the attribute information in the input information and stores the history of the improved input information based on the operation result of the attribute calculation operation, and
   wherein the attribute calculation operation sorts design subjects having similar attribute information in a decreasing order of the degree of effect of improvements corresponding to the descriptions of the improvements by performing an operation on the attribute information of the design subjects.

2. The design method according to claim 1, wherein the attribute calculation operation sorts design subjects based on the descriptions of improvements.

3. The design method according to claim 1, wherein the improved part obtaining operation automatically reflects the attribute information of the description of the improvement having the highest degree of effect of the improvement, which is obtained by the operation by the attribute calculation operation, to the input information.

4. The design method according to claim 1, wherein the similar attribute information is at least one selected from form information, assembly information, surface processing information and material information.

5. The design method according to claim 1, wherein the effect of an improvement corresponding to the description of an improvement is expressed by a numerical value or non-numerical value.

6. The design method according to claim 1, wherein each of the histories includes the description of an improvement obtained through multiple form changes.

7. A recording medium storing a program causing a computer to perform:
   an attribute searching operation searching for a design subject having similar attribute information similar to attribute information on the design subject designed in the past and histories of descriptions of improvements, which are stored in a storage device, based on input information on a design subject;

an improved part obtaining operation obtaining a description of an improvement on the searched design subject having the similar attribute information from the histories;

an attribute calculation operation performing an operation on the similar attribute information of the design subject and obtaining a design subject having the description of an improvement of which has an effect of the improvement; and an output operation outputting improved input information, wherein the improved part obtaining operation obtains attribute information contributing to the improvement of the design subject, reflects the attribute information in the input information and stores the history of the improved input information based on the operation result of the attribute calculation operation, and wherein the attribute calculation operation sorts design subjects having similar attribute information in a decreasing order of the degree of effect of improvements corresponding to the descriptions of the improvements by performing an operation on the attribute information of the design subjects.

8. The recording medium according to claim 7, wherein the improved part obtaining operation automatically reflects the attribute information of the description of the improvement having the highest degree of effect of the improvement, which is obtained by the operation by the attribute calculation operation to the input information.

9. The recording medium according to claim 7, wherein the similar attribute information is at least one selected from form information, assembly information, surface processing information and material information.

10. The recording medium according to claim 7, wherein the effect of an improvement corresponding to the description of an improvement is expressed by a numerical value or non-numerical value.

11. A design apparatus comprising:

an attribute searching device searching for a design subject having similar attribute information similar to attribute information on a design subject designed in the past and histories of descriptions of improvements based on input information on the design subject;

an improved part obtaining device obtaining a description of an improvement on the searched design subject having the similar attribute information from the histories;

an attribute calculation device performing an operation on the similar attribute information of the design subject and obtaining a design subject having the description of an improvement of which has an effect of the improvement; and an output device outputting improved input information, wherein the improved part obtaining device obtains attribute information contributing to the improvement of the design subject, reflects the attribute information in the input information and stores the history of the improved input information based on the operation result of the attribute calculation device, and wherein the attribute calculation device sorts design subjects having similar attribute information in a decreasing order of the degree of effect of improvements corresponding to the descriptions of the improvements by performing an operation on the attribute information of the design subjects.

* * * * *

UNITED STATES PATENT AND TRADEMARK OFFICE
CERTIFICATE OF CORRECTION

PATENT NO. : 8,577,920 B2  
APPLICATION NO. : 12/028554  
DATED : November 5, 2013  
INVENTOR(S) : Hirooki Hayashi Page 1 of 1

It is certified that error appears in the above-identified patent and that said Letters Patent is hereby corrected as shown below:

On the Title page, Item (54), and in the Specification, Column 1, Line 1, Title, Before "METHOD" insert -- DESIGN --.

Signed and Sealed this  
Eleventh Day of February, 2014

Michelle K. Lee  
*Deputy Director of the United States Patent and Trademark Office*